(12) United States Patent
Atesoglu

(10) Patent No.: US 8,378,723 B1
(45) Date of Patent: Feb. 19, 2013

(54) VOLTAGE-CONTROLLED-OSCILLATOR CIRCUITRY WITH POWER SUPPLY NOISE REJECTION

(75) Inventor: Ali Atesoglu, Milpitas, CA (US)

(73) Assignee: Altera Corporation, San Jose, CA (US)

( * ) Notice: Subject to any disclaimer, the term of this patent is extended or adjusted under 35 U.S.C. 154(b) by 20 days.

(21) Appl. No.: 12/910,054

(22) Filed: Oct. 22, 2010

(51) Int. Cl.
*H03L 7/06* (2006.01)
(52) U.S. Cl. .......................... 327/157; 327/148
(58) Field of Classification Search .................. 327/148, 327/157
See application file for complete search history.

(56) References Cited

U.S. PATENT DOCUMENTS

| | | | |
|---|---|---|---|
| 4,749,961 A | 6/1988 | Kato et al. | |
| 5,072,195 A | 12/1991 | Graham et al. | |
| 5,389,898 A | 2/1995 | Taketoshi et al. | |
| 5,563,554 A | 10/1996 | Mizuno | |
| 5,614,868 A | 3/1997 | Nielson | |
| 5,663,945 A | 9/1997 | Hayashi et al. | |
| 5,909,149 A | 6/1999 | Bath et al. | |
| 6,181,213 B1 | 1/2001 | Chang | |
| 6,853,261 B1* | 2/2005 | Ling | 331/100 |
| 7,132,880 B2* | 11/2006 | Ingino, Jr. | 327/541 |
| 2005/0190004 A1* | 9/2005 | Yin et al. | 331/177 V |
| 2005/0280474 A1* | 12/2005 | Roppongi | 331/16 |
| 2006/0220758 A1* | 10/2006 | Rachedine et al. | 331/185 |
| 2008/0136472 A1* | 6/2008 | Shor | 327/156 |
| 2008/0238566 A1* | 10/2008 | Sano et al. | 331/36 C |
| 2008/0297217 A1* | 12/2008 | Welland et al. | 327/159 |
| 2010/0271140 A1* | 10/2010 | Raghunathan et al. | 331/34 |
| 2010/0277245 A1* | 11/2010 | Liu | 331/34 |
| 2010/0295626 A1* | 11/2010 | Kim et al. | 331/117 FE |
| 2010/0308929 A1* | 12/2010 | Kitayama et al. | 331/117 R |
| 2011/0006819 A1* | 1/2011 | Bazes | 327/156 |
| 2011/0234331 A1* | 9/2011 | Ding et al. | 331/36 C |
| 2012/0056654 A1* | 3/2012 | Lee et al. | 327/159 |

OTHER PUBLICATIONS

Bereza, William W., et al., U.S. Appl. No. 12/142,746, filed Jun. 19, 2008.
Ding, Weiqi, et al., U.S. Appl. No. 12/748,261, filed Mar. 26, 2010.

* cited by examiner

*Primary Examiner* — Adam Houston
(74) *Attorney, Agent, or Firm* — Treyz Law Group; Jason Tsai; Chih-Yun Wu

(57) ABSTRACT

Integrated circuits with phase-locked loops are provided. A phase-locked loop may include voltage-controlled-oscillator (VCO) circuitry. The VCO circuitry may include multiple VCO circuits that receive power supply signals from a positive power supply terminal and a ground power supply terminal. Low-pass filters may be connected to the positive and ground power supply terminals to suppress high frequency noise that may be injected through the power supply terminals. The VCO circuitry may be operable in multiple modes. In a given mode, a selected one of the multiple VCO circuits is enabled while disabling the remaining VCO circuits. Switch circuits formed from transmission gates with pull-down transistors may be used to select which VCO circuit is active.

19 Claims, 7 Drawing Sheets

VOLTAGE-CONTROLLED-OSCILLATOR CIRCUITRY WITH POWER SUPPLY NOISE REJECTION

BACKGROUND

This relates generally to integrated circuits, and more particularly, to integrated circuits with wireless communications circuitry.

Wireless integrated circuits such as transceiver circuits and receiver circuits typically include voltage-controlled-oscillator circuitry that is used for clock signal generation. In modern high speed wireless communications integrated circuits (e.g., integrated circuits that transmit and receive radio-frequency signals having frequencies that are higher than 1 GHz), LC-based voltage-controlled oscillators are used in circuits such as phase-locked loops. LC-based voltage-controlled oscillators (e.g., voltage-controlled oscillators that include inductors and capacitors) may exhibit desirable phase noise and jitter performance in comparison to ring-based voltage-controlled oscillators.

A conventional LC-based voltage-controlled oscillator (LC VCO) may suffer from high frequency noise injected at positive power supply and ground power supply terminals of the conventional LC VCO. Noise voltage injected at the positive and ground power supply terminals may undesirably affect the phase noise and jitter performance of the LC VCO.

The operating frequency range of a phase-locked loop may be limited by the frequency tuning range of its LC VCO. A conventional phase-locked loop typically includes a single LC VCO. The single LC VCO has a fixed inductor (i.e., an inductor that has a fixed inductance value) and a varactor (i.e., a voltage-controlled capacitor). Because the value of the inductance is fixed, the frequency tuning range of the oscillator is limited by the amount of capacitance tuning that can be achieved using the varactor.

It would therefore be desirable to be able to provide voltage-controlled-oscillator circuitry with improved phase noise performance and frequency tuning range.

SUMMARY

Integrated circuits may include wireless communications circuitry such as a phase-locked loop. A phase-locked loop may include LC-based voltage-controlled oscillator (LC VCO) circuitry (e.g., VCO circuitry that includes inductors and variable capacitors).

The VCO circuitry may receive positive power supply signals from a positive power supply terminal and may receive ground power supply signals from a ground power supply terminal. The VCO circuitry may include a first low-pass filter that is coupled to the positive power supply terminal and may include a second low-pass filter that is coupled to the ground power supply terminal. The first and second low-pass filters may serve to reject power supply noise injected through the power supply terminals from external power sources. Rejecting power supply noise using this approach may provide desirable phase noise and jitter performance for the VCO circuitry.

The VCO circuitry may include multiple VCO circuits coupled between the positive power supply terminal and the ground power supply terminal. For example, VCO circuitry may include first and second VCO circuits. Only one of the first and second VCO circuits may be selected for use during operation of the VCO circuitry. In a first mode, the first VCO circuit may be enabled while disabling the second VCO circuit. In a second mode, the second VCO circuit may be turned on while turning off the first VCO circuit (as an example). The multiple VCO circuits may each be used to provide different frequency tuning ranges.

Each VCO circuit may be operable in a high frequency mode or a low frequency mode. For example, the first VCO circuit may be used to provide a frequency range of 12-15 GHz in the high frequency mode or may provide a frequency range of 10-13 GHz in the low frequency mode. The second VCO circuit may be used to provide a frequency range of 8-11 GHz in the high frequency mode or may provide a frequency range of 6-9 GHz in the low frequency mode.

Further features of the present invention, its nature and various advantages will be more apparent from the accompanying drawings and the following detailed description.

DETAILED DESCRIPTION

This relates generally to integrated circuits and more particularly, to integrated circuits with oscillator circuitry. Oscillator circuitry such LC-based voltage-controlled-oscillator circuitry (e.g., voltage-controlled-oscillator circuitry that includes inductor and voltage-controlled capacitors) may be used in integrated circuits that have wireless communications circuitry. Such wireless integrated circuits may be any suitable type of integrated circuits, including processors, memory chips, programmable integrated circuits, application-specific integrated circuits, audio and video circuits, etc.

Figure 1:
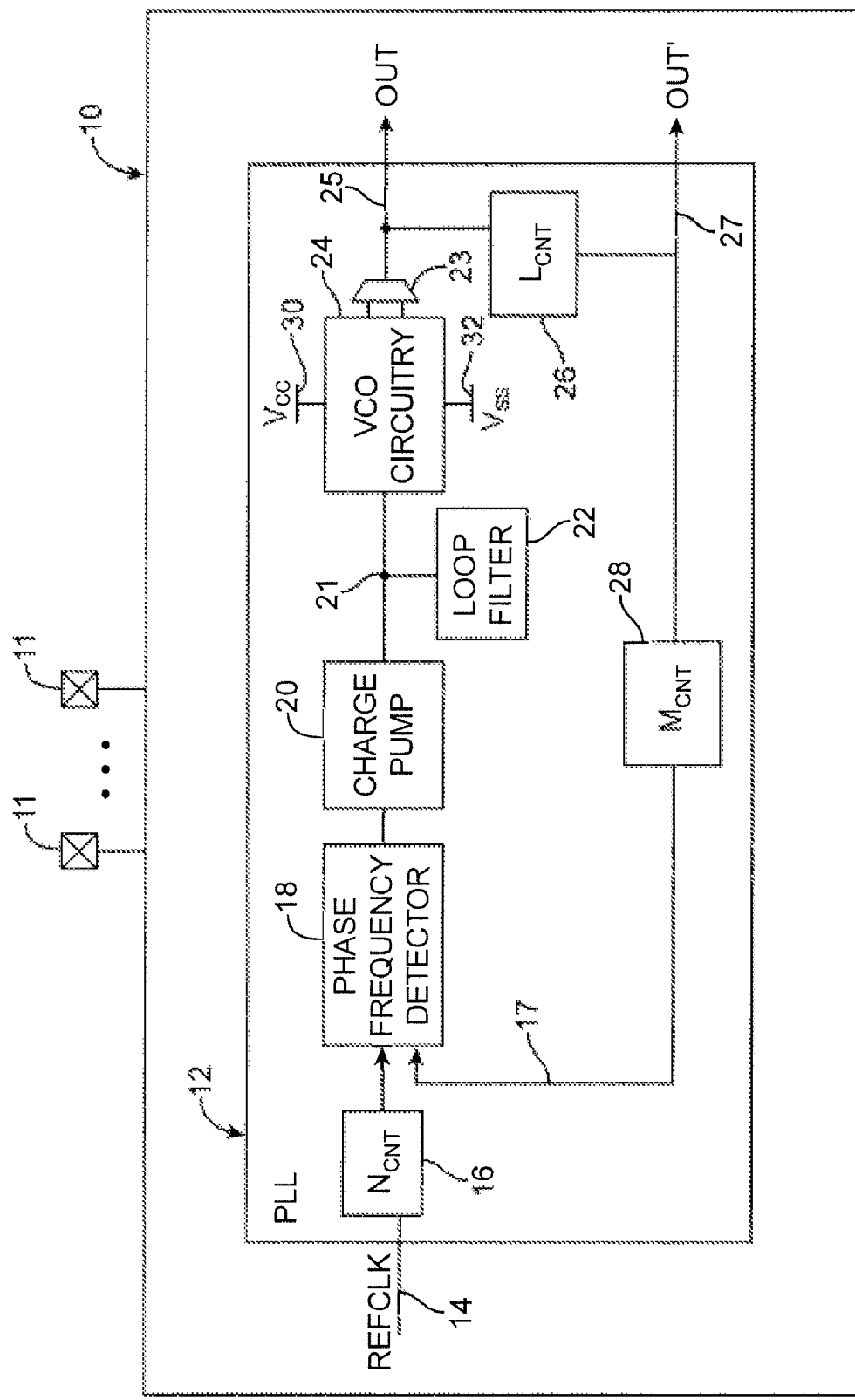
FIG. 1 is a diagram of an illustrative phase-locked loop in accordance with an embodiment of the present invention.

An integrated circuit such as an integrated circuit with wireless communications capabilities is shown in FIG. 1. Integrated circuit 10 may include wireless circuitry such as a phase-locked loop (PLL) 12, frequency mixers, filters, power amplifiers (PAs), low noise amplifiers (LNAs), and other wireless circuits, and may therefore sometimes be referred to as a wireless integrated circuit.

As shown in FIG. 1, phase-locked loop 12 may include a phase-frequency detector (PFD) such as phase-frequency detector 18, a charge pump such as charge pump 20, a loop filter such as loop filter 22, voltage-controlled oscillator (VCO) circuitry such as voltage-controlled-oscillator circuitry 24, and counters (e.g., dividers) such as counters $L_{CNT}$ (26), $M_{CNT}$ (28), and $N_{CNT}$ (16).

VCO circuitry 24 may receive positive power supply voltage Vcc from positive power supply terminal 30 and may receive ground power supply voltage Vss from ground power supply terminal 32. Voltage Vss may be supplied from a ground pin on an integrated circuit that contains the circuitry of FIG. 2 or other ground voltage source and may be distributed by ground paths to each of the nodes that is labeled "Vss" in FIG. 2. Power supply terminals 30 and 32 may be coupled to external power supply equipment through input-output (I/O) pins 11. Power supply signals provided from off-chip power supply equipment may suffer from noise and undesirable glitches. VCO circuitry 24 may include low-pass filters that are connected to positive power supply terminal 30 and ground power supply terminal 32 to remove (reject) noise injected at power supply terminals 30 and 32.

VCO circuitry 24 may include LC-based voltage-controlled-oscillator circuits. Each voltage-controlled-oscillator circuit may include an inductor and a voltage-controlled capacitor circuit (sometimes referred to as a varactor circuit or a variable capacitor circuit). A selected one of the voltage-controlled-oscillator circuits may be enabled while disabling the voltage-controlled-oscillator circuits other than the selected voltage-controlled-oscillator circuit. Frequency tuning may be provided by adjusting the capacitance of the varactor circuit in the selected voltage-controlled-oscillator circuit.

With this type of arrangement, each voltage-controlled-oscillator circuit may be used to provide a desired frequency tuning range. For example, consider a scenario in which VCO circuitry 24 includes a first voltage-controlled-oscillator circuit and a second voltage-controlled-oscillator circuit. The first voltage-controlled-oscillator circuit may include a first inductor and a first varactor circuit, whereas the second voltage-controlled-oscillator circuit may include a second inductor and a second varactor circuit. The first and second inductors may exhibit different inductance values, whereas the first and second varactor circuits may exhibit the same or different capacitance values. The first voltage-controlled-oscillator circuit may be used to provide a first frequency tuning range of 12 GHz to 16 GHz, whereas the second voltage-controlled-oscillator circuit may be used to provide a second frequency tuning range of 6 GHz to 10 GHz (as an example).

Depending on the desired frequency tuning range, one of the first and second voltage-controlled-oscillator circuits may be selected for use during normal (wireless) operation. Frequency tuning for each voltage-controlled-oscillator circuit may be performed by making voltage adjustments to the varactor circuit in the selected voltage-controlled-oscillator circuit.

As shown in FIG. 1, phase-frequency detector 18 may receive a reference clock signal REFCLK through divider 16. Reference clock signal REFCLK may be provided at input 14 from an off-chip oscillator such as a crystal oscillator or from an external signal generator (as examples).

Phase-frequency detector 18 may also receive a feedback signal over line 17. Phase-frequency detector 18 may be used to compare the signal on line 17 with signal REFCLK to generate a corresponding error control signal for charge pump 20. The error signal may direct charge pump 20 to generate a corresponding output current. Loop filter 22 may receive the output current and produce a control voltage signal at output 21, as needed to lock the frequency of circuit 12 to some integer multiple of the frequency of signal REFCLK. Loop filter 22 may be connected to output line 21 to ensure that output signals generated by PLL 12 do not suffer from undesirable ringing.

VCO circuitry 24 may have an input that is connected to line 21. VCO circuitry 24 may generate a clock signal having a frequency that is controlled by adjusting the voltage level on line 21.

VCO circuitry 24 may generate an output clock control signal OUT over its output line 25. Signal OUT may be fed through divider 26 to produce another output clock signal OUT' on line 27 (see, e.g., FIG. 1). Line 27 may be coupled to line 17 through divider 28 to form a feedback path. Lines 25 and 27 may be connected to other wireless circuitry to provide other circuits with desired control clock signals.

Divider 26 may be used to divide signal OUT by an appropriate integer L (e.g., by one, by two, by three, etc.) to produce signal OUT'. Divider 28 may be used to divide signal OUT' by a desired integer M (e.g., by two, by four, by five, etc.) before feeding the divided signal onto line 17. Dividers 16, 26, and 28 preferably contain programmable elements, so that the integer setting of each divider can be adjusted according to user preference.

The amount by which counters 16, 26, and 28 divide clock signal OUT determines the ratio between the frequency of signal REFCLK and signal OUT. The upper limit of the frequency of signal OUT may be calculated as shown in equation 1.

$$f_{OSC} \leq f_{REFCLK} * L * M/N \tag{1}$$

As shown in equation 1, the frequency of signal OUT ($f_{OSC}$) is less than or equal to the product of the frequency of signal REFCLK ($f_{REFCLK}$) r integer L (e.g., an integer divisor provided by divider 26), and integer M (e.g., an integer divisor provided by divider 28) divided by integer N (e.g., an integer divisor provided by divider 16). For example, consider a scenario in which $f_{REFCLK}$ is equal to 100 MHz, L is equal to 4, M is equal to 16, and N is equal to 1. PLL 12 may therefore generate output signals with a frequency $f_{OSC}$ that is equal to 6.4 GHz (4*16*100 MHz) and $f_{OSC}$, that is equal to 1.6 GHz (6.4 GHz divided by 4).

Figure 2:
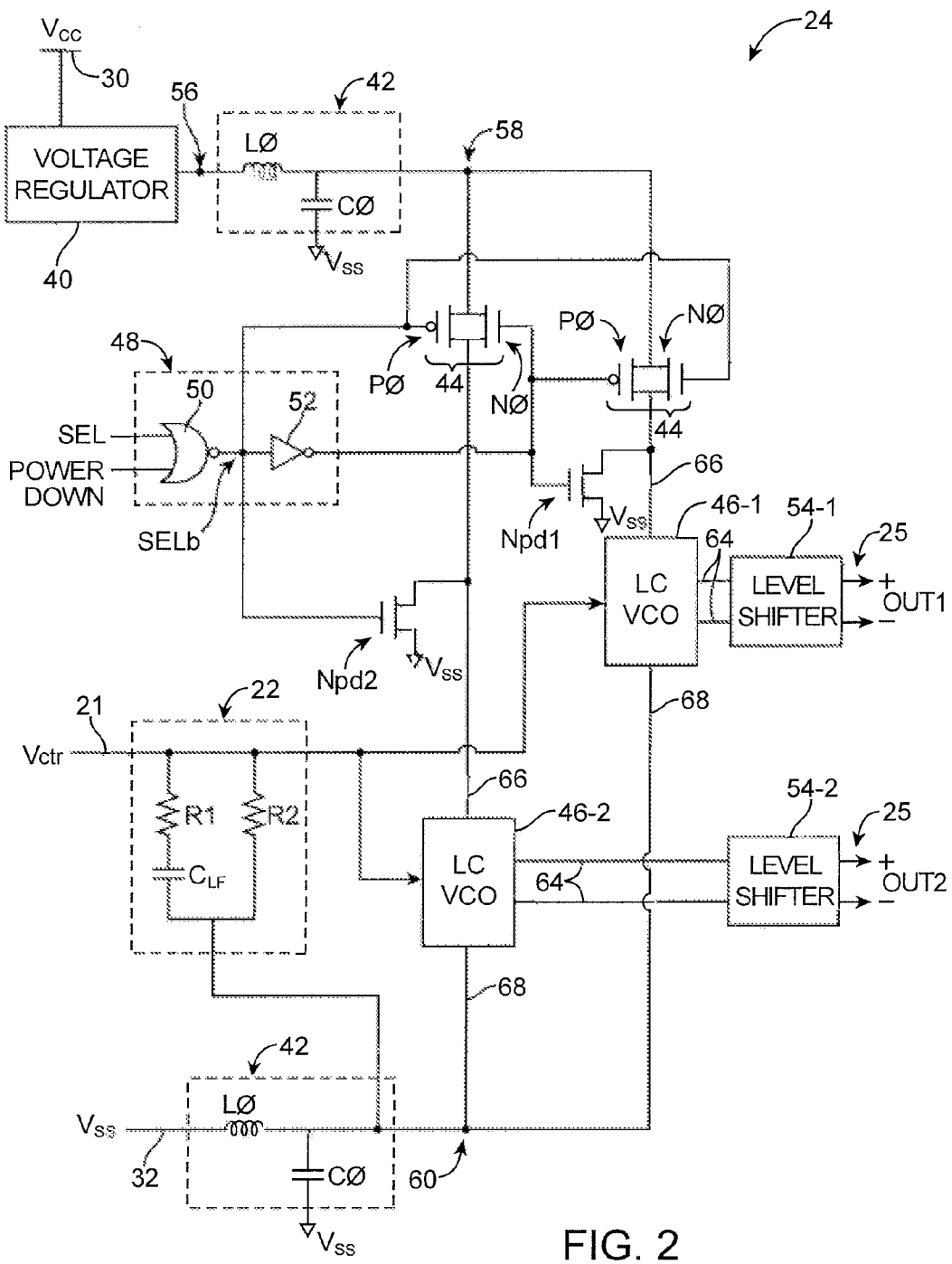
FIG. 2 is a circuit diagram of illustrative voltage-controlled-oscillator circuitry in accordance with an embodiment of the present invention.

A circuit diagram of VCO circuitry 24 is shown in FIG. 2. As shown in FIG. 2, VCO circuitry 24 may include multiple VCO circuits such as VCO circuit 46-1 and VCO circuit 46-2. VCO circuits 46-1 and 46-2 may be LC-based VCO circuits (e.g., VCO circuits that include inductors and variable capacitors) and may therefore sometimes be referred to as LC VCOs. VCO circuits 46-1 and 46-2 may be coupled between positive power supply terminal 30 and ground power supply terminal 32. Positive power supply terminal may be connected to a voltage regulator such as voltage regulator 40. Voltage regulator 40 may be used to produce a reduced voltage at its output 56. For example, positive power supply voltage Vcc provided at terminal 30 may exhibit a voltage level of 3V. Voltage regulator 40 may receive voltage Vcc and provided a regulated voltage level of 1.3 V at node 56 (as an example).

High frequency noise may be injected into node 56 through input-output pins 11 (FIG. 1). Circuitry 24 may include a power supply terminal low-pass filter (LPF) such as power supply terminal low-pass filter 42 coupled to positive power supply terminal 30. Low-pass filter 42 may, for example, be connected between node 56 and node 58 (e.g., a node that is coupled to the positive power supply terminals of VCOs 46-1 and 46-2). Low-pass filter 42 may include inductor L0 and capacitor C0. Inductor L0 may be connected between nodes 56 and 58, whereas capacitor C0 may be connected between node 58 and a ground line (e.g., a line with a voltage reference level of zero volts).

For example, inductor L0 may have an inductance value of 20 nH, whereas capacitor C0 may have a capacitance value of 15 pF. Inductor L0 may have an associated parasitic series resistance. Capacitor C0 and the parasitic series resistance that is associated with inductor L0 may provide low-pass filter 42 with a cut-off frequency (sometimes referred to as a 3 dB breakpoint) of 300 MHz (as an example). In this example, low-pass filter 42 may be capable of rejecting power supply noise with frequencies greater than 300 MHz. Filtering out power supply noise in this way may improve the phase noise and jitter performance of VCO circuitry 24 (and PLL 12). The voltage at node 58 may, for example, be equal to 1.2 V, because the parasitic series resistance associated with inductor L0 may result in a slight voltage drop between nodes 56 and 58.

Power supply noise injected through ground power supply terminal 32 may also be filtered using this approach. As shown in FIG. 2, low-pass filter 42 may be connected between ground power supply terminal 32 and node 60 (e.g., a node that is coupled to the ground power supply terminals of VCOs 46-1 and 46-2). Filter 42 that is used to filter out noise injected through positive power supply terminal 30 and filter 42 that is used to filter out noise injected through ground power supply terminal 32 may have identical inductance and capacitance values and identical circuit layout arrangements to reduce design effort, if desired.

LC VCO circuits 46-1 and 46-2 may be used to provide different frequency tuning ranges. For example, VCO circuit 46-1 may be used to provide output signals having a first frequency range of 10 GHz to 14 GHz, whereas VCO circuit 46-2 may be used to provided output signals having a second frequency range of 7 GHz to 12 GHz. Only one of VCO circuits 46-1 and 46-2 may be selected for use during normal operation of circuitry 24 (e.g., a selected one of the VCO circuits may be turned on, while the unselected VCO circuit is turned off). VCO circuits 46-1 and 46-2 configured in this way may therefore collectively be used to provide a frequency tuning of 7 GHz (e.g., the lower bound of VCO circuit 46-2) to 14 GHz (e.g., the upper bound of VCO circuit 46-1).

VCO circuits 46-1 and 46-2 may each have a positive power supply terminal such as terminal 66 and a ground power supply terminal such as terminal 68. Power supply terminal 66 of VCO circuit 46-1 may be connected to node 58 through a first switch circuit such as a first transmission gate (sometimes referred to as a pass gate) 44, whereas power supply terminal 66 of VCO circuit 46-2 may be connected to node 58 through a second switch circuit such as a second pass gate 44.

Each pass gate 44 may include an n-channel transistor N0 (e.g., an n-channel metal-oxide-semiconductor transistor) and a p-channel transistor P0 (e.g., a p-channel metal-oxide-semiconductor transistor) connected in parallel. N-channel transistor N0 may have a transistor width of 500 μm and any suitable transistor gate length, whereas p-channel transistor P0 may have a transistor width of 1000 μm and any suitable transistor gate length (as examples). Switch circuits 44 may also each be formed from a single transistor, from more than two transistors, from different types of transistor-based switching circuitry, etc.

First and second pass gates 44 may be controlled by control circuit 48 (see, e.g., FIG. 2). Control circuit 48 may receive control signals SEL and POWERDOWN. Signal POWERDOWN may be used enable or disable VCO circuitry 24. For example, if POWERDOWN is high, circuitry 24 will not be able to select between VCO circuits 46-1 and 46-2. If POWERDOWN is low, circuitry 24 may be configured to provide radio-frequency output control signals (e.g., clock control signals) at desired frequencies.

Signal SEL may be used to enable either VCO circuit 46-1 or VCO circuit 46-2. For example, if select signal SEL is high, VCO circuit 46-1 will be turned on while VCO circuit 46-2 will be turned off (e.g., first transmission gate 44 will allow passage of the positive power supply voltage signal at node 58 to terminal 66 of circuit 46-1, whereas second transmission gate 44 will prevent passage of the positive power supply voltage signal at node 58 to terminal 66 of circuit 46-2). If SEL is low, VCO circuit 46-2 will be enabled while VCO circuit 46-1 will be disabled (e.g., the positive power supply voltage at node 58 will pass through second transmission gate 44 to power circuit 46-2 but will not pass through first transmission gate 44 to power circuit 46-1).

Control circuit may include a logic NOR gate such as logic NOR gate 50 and an inverter such as inverter 52. Gates 50 and 52 may be connected in series. NOR gate 50 may have first and second inputs that receive signals SEL and POWERDOWN and an output at which signal SELb is provided. The output of gate 50 may be connected to an input of inverter 52. Inverter 52 may have an output at which an inverted version of signal SELb is provided. Transistor N0 of the first pass gate and transistor P0 of the second pass gate may be controlled by signal SELb. Transistor P0 of the first pass gate and transistor N0 of the second pass gate may be controlled by the inverted version of signal SELb generated at the output of inverter 52. The polarity of the inverted version of signal SELb and SEL may be equal.

A first pull-down transistor such as n-channel transistor Npd1 may be connected to terminal 66 of VCO circuit 46-1. Transistor Npd1 may have a drain terminal that is connected to terminal 66 of VCO circuit 46-1, a source terminal that is connected to the ground line, and a gate that is connected to the output of inverter 52. Connected using this arrangement, transistor Npd1 may serve to drive terminal 66 of circuit 46-1 to zero volts to completely turn off circuit 46-1 when signal SEL is low (e.g., when circuit 46-2 is enabled).

Similarly, a second pull-down transistor such as n-channel transistor Npd2 may be connected to terminal 66 of VCO circuit 46-2. Transistor Npd2 may have a drain terminal that is connected to terminal 66 of VCO circuit 46-2, a source terminal that is connected to the ground line, and a gate that is controlled by signal SELb. Connected in this arrangement, transistor Npd2 may serve to pull terminal 66 of circuit 46-2 down to zero volts to completely disable circuit 46-2 when signal SEL is high (e.g., when circuit 46-1 is turned on).

Pull-down transistors such as transistors Npd1 and Npd2 of FIG. 2 assist the operation of the other switching circuits in FIG. 2 (i.e., the switching circuits 44) and may therefore sometimes be referred to as forming part of switching circuits 44.

VCO circuits 46-1 and 46-2 may each have a control input that receives a control signal such as voltage control signal Vctr over line 21. The magnitude of signal Vctr may be adjusted by charge pump 20 to determine the oscillation frequency of VCO circuits 46-1 and 46-2. For example, consider a scenario in which VCO circuit 46-1 is selected for use (i.e., VCO circuit 46-2 is turned off). If control signal Vctr is equal to 0.5 V, VCO circuit 46-1 may generate a 7 GHz radio-frequency signal. If control signal Vctr is equal to 1.0 V, VCO circuit 46-1 may generate a 10 GHz radio-frequency signal.

As shown in FIG. 2, loop filter 22 may be connected between line 21 and node 60. Loop filter 22 may include resistor R1 and capacitor $C_{LF}$ connected in series between line 21 and node 60 and resistor R2 connected between line 21 and node 60. Loop filter 22 may be a low-pass filter that serves to ensure minimal ringing (voltage overshoot) in the output signals generated by circuitry 24.

VCO circuits 46-1 and 46-2 may each have output lines connected to an associated level shifter (e.g., a level shift circuit). For example, VCO circuit 46-1 may have a pair of output lines 64 that are connected to inputs of level shifter 54-1, whereas VCO circuit 46-2 may have a pair of output lines 64 that are connected to inputs of level shifter 54-2. VCO circuits 46-1 and 46-2 and associated level shifters 54-1 and 54-2 may be differential circuits (e.g., circuits that can receive and/or output differential signals).

Level shifters 54-1 and 54-2 may be used to generate digital signals (e.g., square-wave clock signals that swing rail-to-rail between the voltage at terminal 66 and the voltage at terminal 68) at each of their respective pair of output lines 25. For example, level shifter 54-1 may generate differential output signals OUT1 at output lines 25 during a first mode when VCO circuit 46-1 is enabled, whereas level shifter 54-2 may generate differential output signals OUT2 at output lines 25 during a second mode when VCO circuit 46-2 is selected for use in circuitry 24. A circuit such as a multiplexer may be interposed in the phase-locked loop between outputs OUT1 and OUT2 and path 25. The multiplexer may receive OUT1 and OUT2 as inputs and may route signals from a respective one of these inputs to its output (coupled to path 25). Inputs OUT1 and OUT2 may be differential and the output may be single-ended or the multiplexer may handle both input and output signals in differential form (as an example). Other circuit arrangements for selectively routing signals OUT1 and OUT2 to the output (and feedback path) of the phase-locked loop may be used if desired. For example a positive signal line in OUT1 and a positive signal line in OUT2 may be tied together and a negative signal line in OUT1 and a negative signal line in OUT2 may be tied together. The use of a multiplexer (shown as multiplexer 23 in FIG. 1) is merely illustrative. Multiplexer 23 may be controlled by control signals from circuit 48 or other suitable control circuitry.

The example of FIG. 2 is merely illustrative. If desired, VCO circuitry 24 may include more than two VCO circuits to provide desired the frequency tuning range.

Figure 3:
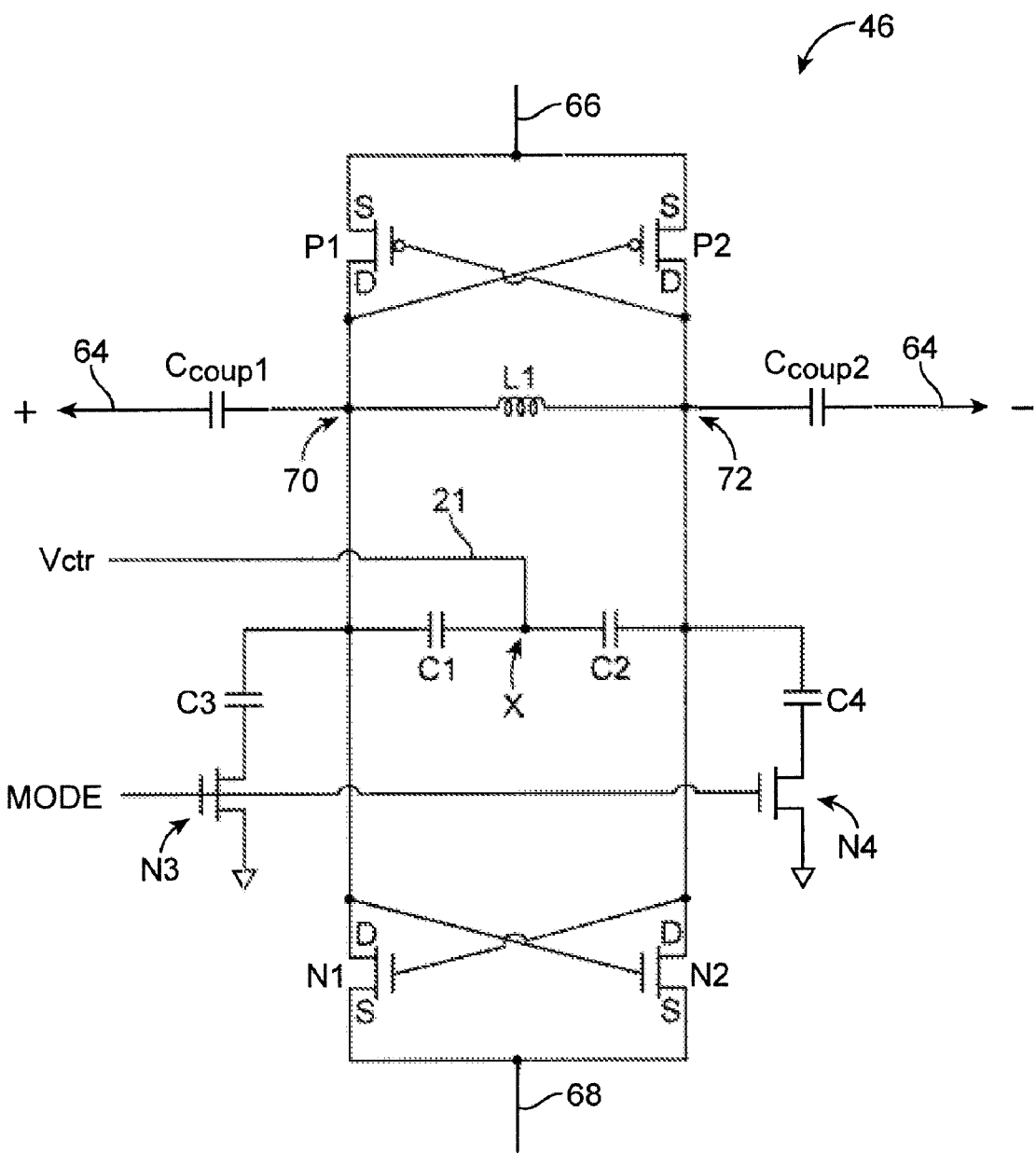
FIG. 3 is a circuit diagram of an illustrative voltage-controlled-oscillator circuit in accordance with an embodiment of the present invention.

FIG. 3 shows one possible circuit implementation of VCO circuit 46 (e.g., oscillator circuit 46-1 or oscillator circuit 46-2 may be implemented using this configuration). Circuit 46 may be coupled between oscillator circuit positive power supply terminal 66 and oscillator circuit ground power supply terminal 68.

VCO circuit 46 may include first and second transistor pairs, an inductor L1, and first and second varactor circuits (variable capacitor circuits) C1 and C2. The first transistor pair may include p-channel transistor P1 and n-channel transistor N1 connected in series. The second transistor pair may include p-channel transistor P2 and n-channel transistor N2 connected in series. Source terminals of transistors P1 and P2 may be connected to supply line 66 while source terminals of transistors N1 and N2 may be connected to ground line 68. Drain terminals of transistors P1 and N1 may be connected to a first intermediate node 70 while drain terminals of transistors P2 and N2 may be connected to a second intermediate node 72. Transistors P1 and N1 in the first transistor pair may have gates (or gate terminals) that are connected to intermediate node 72, whereas transistors P2 and N2 in the second transistor pair may have gates that are connected to intermediate node 70.

Inductor L1 may be connected between intermediate nodes 70 and 72. Inductor L1 may be a spiral inductor formed on device 10. Inductor L1 may have a square shape, octagonal shape, hexagonal shape, or other suitable shapes and may be formed in one or more metal routing layers in an integrated circuit dielectric stack.

First varactor circuit C1 may be connected between node 70 and intermediate node X, whereas second varactor circuit C2 may be connected between node 72 and intermediate node X (see, e.g., FIG. 3). Varactor circuits C1 and C2 are voltage-controlled capacitor circuits. Varactor circuits C1 and C2 may exhibit a capacitance value that is dependent on voltage Vctr provided over line 21. For example, consider a scenario in which the voltage level on line 21 increases. This increase in voltage may adjust varactor circuits C1 and C2 to decrease their capacitance values by a predetermined amount.

The oscillation frequency of VCO circuit 46 may depend on the value of inductor L1 and the values of varactor circuits C1 and C2. Varactor circuits C1 and C2 may exhibit the same capacitance value (as an example). The frequency of oscillation of circuit 46 may be computed as shown in equation 2.

$$f_{OSC} = 1/[2\pi*(LC)^{0.5}] \qquad (2)$$

As shown in equation 2, oscillation frequency $f_{OSC}$ is equal to the reciprocal of the product of two, pi, and the square root of L times C, where L is the inductance value of inductor L1 and where C is the capacitance value of capacitor C1 (or C2). For example, consider a scenario in which C is equal to 1 pF and L is equal to 0.5 nH. In this example, LC VCO circuit 46 may oscillate at $f_{OSC}$ that is approximately equal to 7.1 GHz ($1/[2\pi*(0.5*10^{-9}*1*10^{-12})^{0.5}]$). Circuit 46 may have any suitable inductance and capacitance value to provide the desired oscillation frequency.

Node 70 may be coupled to first output line 64 through coupling capacitor Ccoup1, whereas node 72 may be coupled to second output line 64 through coupling capacitor Ccoup2. First and second coupling capacitors Ccoup1 and Ccoup2 may each be 50 fF (as an example) and may serve to couple radio-frequency signals to the following circuit (e.g., to the corresponding level shift circuit). The radio-frequency signals may be conveyed over first and second output lines 64 as differential signals.

Additional varactor circuits such as varactor circuits C3 and C4 may be included in circuit 46 (see, e.g., FIG. 3). Varactor circuit C3 and n-channel transistor N3 may be connected in series between node 70 and the ground line. Varactor circuit C4 and n-channel transistor N4 may be connected in series between node 72 and the ground line. Transistors N3 and N4 may have gates that are controlled by control signal MODE.

VCO circuit 46 may be operable in a high frequency mode and a low frequency mode. Signal MODE may be low to disconnect varactor circuits C3 and C4 from circuit 46 during the high frequency mode. Signal MODE may be high to enable varactor circuits C3 and C4 during the low frequency mode. Turning on transistors N3 and N4 to enable varactor circuits C3 and C4 effectively increases the capacitance of the resonating tank (e.g., a parallel connection of the oscillator inductor L1 and capacitors C1 and C2) and therefore reduces $f_{OSC}$ (see, e.g., equation 2). For example, varactor circuit 46 may have a first frequency tuning range of 8-11 GHz during the high frequency mode, whereas varactor circuit 46 may have a second frequency tuning range of 6-9 GHz during the low frequency mode. The first and second frequency tuning ranges may have overlapping frequencies (as an example).

Figure 4:
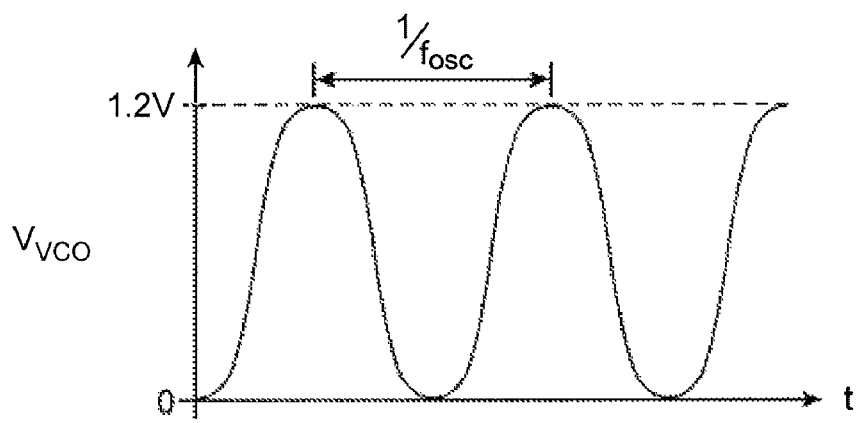
FIG. 4 is a plot illustrating how signals may vary in time at an output of the voltage-controlled-oscillator circuit of FIG. 3 in accordance with an embodiment of the present invention.
Figure 5:
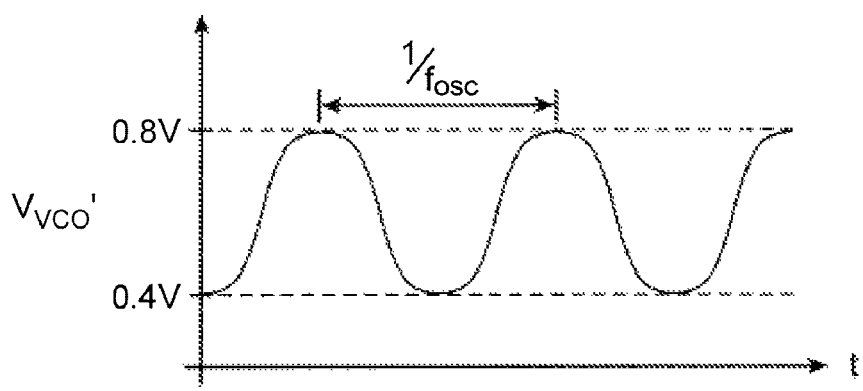
FIG. 5 is a plot illustrating how signals may vary in time at an input of a level shift circuit in the voltage-controlled-oscillator circuitry of FIG. 2 in accordance with an embodiment of the present invention.
Figure 6:
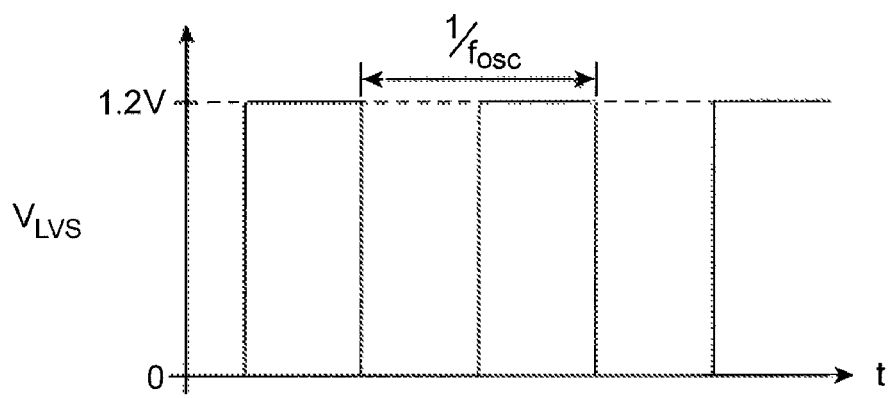
FIG. 6 is a plot illustrating how signals may vary in time at an output of a level shift circuit in the voltage-controlled-oscillator circuitry of FIG. 2 in accordance with an embodiment of the present invention.

Waveforms of radio-frequency (RF) signals generated by VCO circuitry 24 are shown in FIGS. 4, 5, and 6. As shown in FIG. 4, the differential RF signals generated across nodes 70 and 72 of FIG. 3 may swing rail-to-rail (e.g., the RF signals may be a sinusoidal signal having peaks with a voltage level of 1.2V and troughs with a voltage level of zero volts) and may have a wave period that is equal to the reciprocal of $f_{OSC}$.

The differential RF signal waveform generated across output lines 64 is shown in FIG. 5. The input capacitance of the level shifter following a given VCO circuit may result in capacitive division between coupling capacitors Ccoupl1 (Ccoupl2) and the input loading capacitance of the level shifter. This capacitive division may cause the signal amplitude at the input of the level shifter to be reduced. For example, the differential RF signals generated at the input of the level shifter may have a reduced peak-to-peak magnitude of 0.4 V (e.g., the RF signals may be a sinusoidal signal having peaks with a voltage level of 0.8 V and troughs with a voltage level of 0.4 V) and may have a wave period that is equal to the reciprocal of $f_{OSC}$.

FIG. 6 shows the waveform generated at the output of level shifter 54-1 (or 54-2). As shown in FIG. 6, the RF signals (e.g. signal OUT of FIG. 1) generated at the output of level shifter 54-1 may be a digital square-wave clock control signal having a clock period that is equal to the reciprocal of $f_{OSC}$. This clock control signal may be a single-ended or differential signal and may be fed to other wireless circuitry on device 10.

Figure 7:
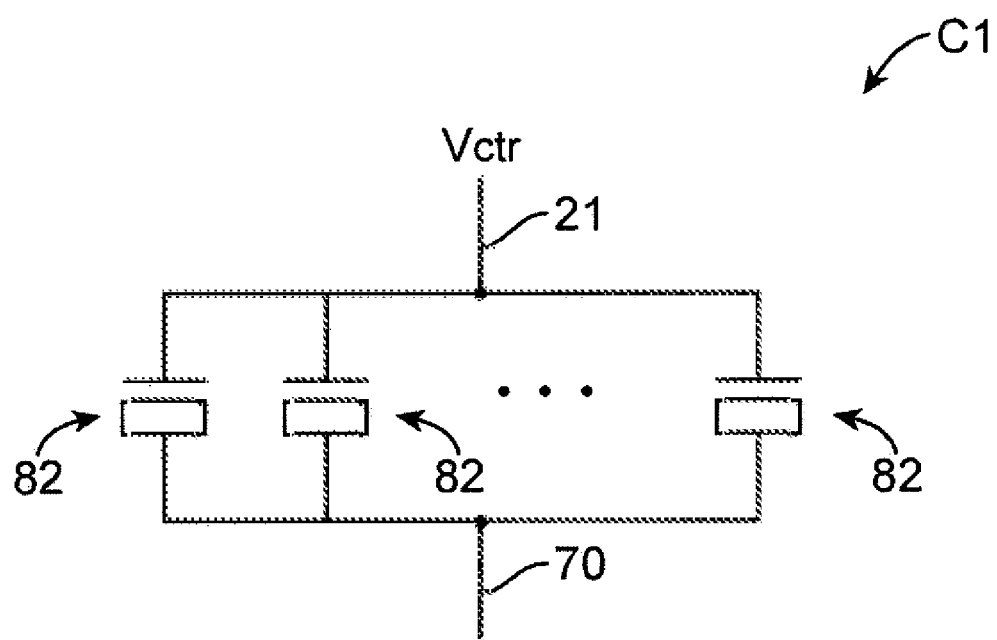
FIG. 7 is a diagram of an illustrative varactor circuit in accordance with an embodiment of the present invention.

FIG. 7 shows one possible circuit implementation of varactor circuit C1. As shown in FIG. 7, varactor circuit C1 may include multiple varactors 82 (sometimes referred to as variable capacitors or varicaps) connected in parallel. Each varicap 82 may be formed by shorting the source-drain terminals of an n-channel transistor (as an example). The n-channel transistor may have a gate that serves as a first terminal of varicap 82, whereas the source-drain terminals serve as a second terminal of varicap 82. Varactor circuit C1 may include a desired number of varicaps 82 to provide the desired capacitance value. Varactor circuits C2, C3, and C4 may be implemented using a similar configuration.

Figure 8:
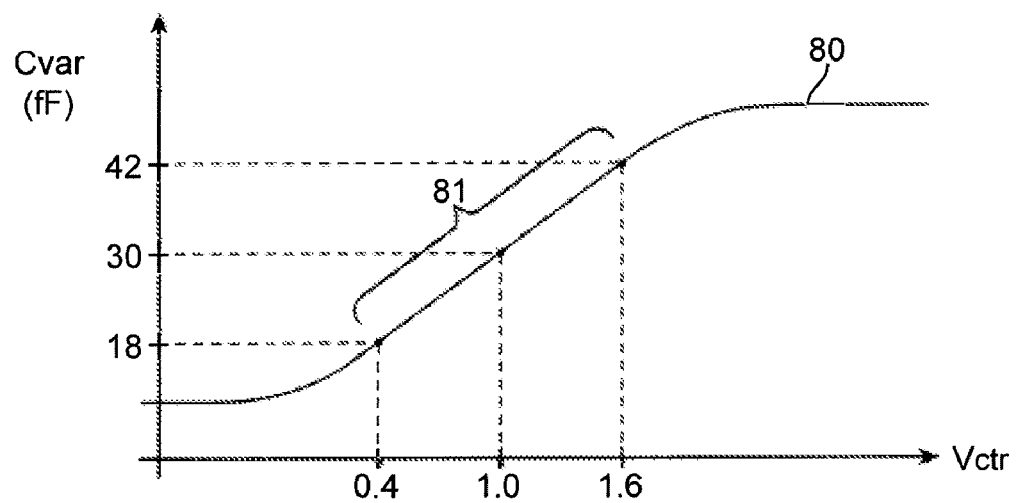
FIG. 8 is a graph illustrating how the capacitance of a varactor may vary as a function of control voltage in accordance with an embodiment of the present invention.

The behavior of each varactor 82 may be characterized by the graph shown in FIG. 8. FIG. 8 plots capacitance Cvar against the magnitude of control voltage Vctr that is applied to the first terminal of varactor 82. In the example of FIG. 8, varactor 82 may exhibit a capacitance value of 18 fF when Vctr is equal to 0.4 V and may exhibit a capacitance value of 42 fF when Vctr is equal to 1.6 V. It may be desirable to adjust varactor 82 within a tuning range (i.e., to operate varactor 82 within a portion of line 80 that has positive slope) such as range 81. For example, consider a scenario in which varactor circuit C2 has 20 varactors 82 connected in parallel. If Vctr is adjusted to be equal to 1.0 V, varactor circuit C2 will exhibit a capacitance value of 600 fF (20*30 fF), as an example.

Figure 9:
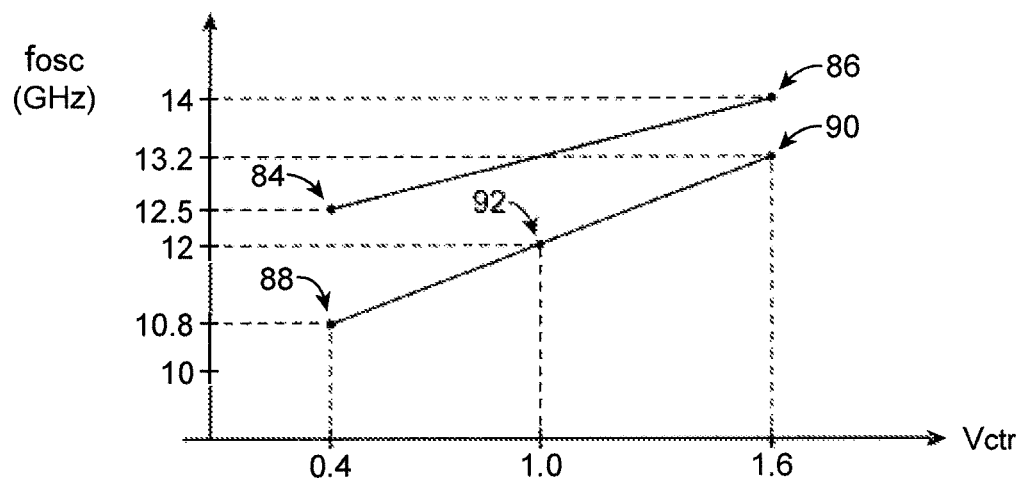
FIGS. 9 and 10 are diagrams showing possible frequency ranges that can be obtained by the voltage-controlled-oscillator circuitry of FIG. 2 in accordance with an embodiment of the present invention.

FIG. 9 shows possible frequency tuning ranges in a first mode when VCO circuit 46-1 is selected for use during normal wireless operation (e.g., when VCO circuit 46-1 is turned on while VCO circuit 46-2 is turned off). In the first mode, VCO circuit 46-1 may be operable in a high frequency mode or a low frequency mode. In the high frequency mode (e.g., when signal MODE in circuit 46-1 is low), circuit 46-1 may be able to produce RF signals with a frequency range of 12.5 GHz to 14 GHz when Vctr is adjusted from 0.4 V to 1.6 V (see, e.g., points 84 and 86 in FIG. 9). In the low frequency mode (e.g., when signal MODE in circuit 46-1 is high), circuit 46-1 may be able to produce RF signals with a frequency range of 10.8 GHz to 13.2 GHz when Vctr is adjusted from 0.4 V to 1.6 V (see, e.g., points 88 and 90 in FIG. 9). In this example, circuit 46-1 in the low frequency mode may generate RF signals with an oscillation frequency of 12 GHz when Vctr is equal to 1.0 V (point 92).

Figure 10:
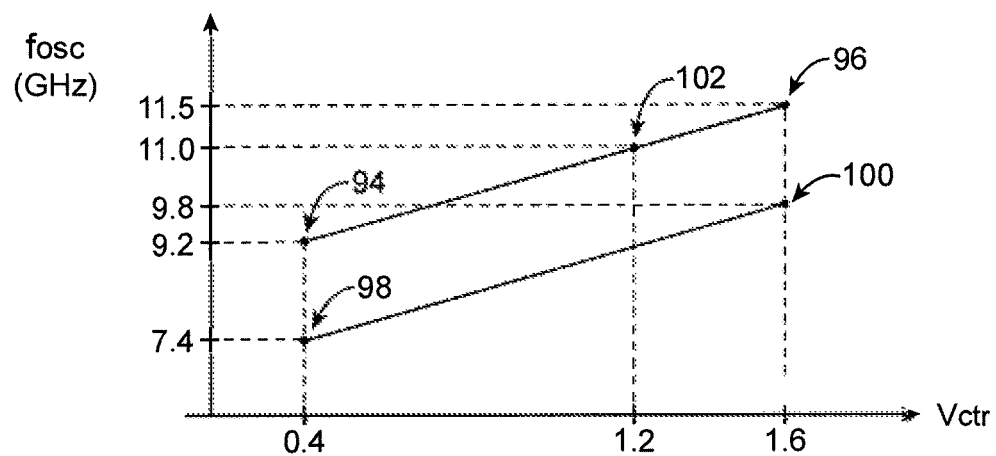

FIG. 10 shows possible frequency tuning ranges in a second mode when VCO circuit 46-2 is selected for use during normal wireless operation (e.g., when VCO circuit 46-2 is turned on while VCO circuit 46-1 is turned off). In the second mode, VCO circuit 46-2 may be operable in a high frequency mode or a low frequency mode. In the high frequency mode (e.g., when signal MODE in circuit 46-2 is low), circuit 46-2 may be able to produce RF signals with a frequency range of 9.2 GHz to 11.5 GHz when Vctr is adjusted from 0.4 V to 1.6 V (see, e.g., points 94 and 96 in FIG. 10). In the low frequency mode (e.g., when signal MODE in circuit 46-2 is high), circuit 46-2 may be able to produce RF signals with a frequency range of 7.4 GHz to 9.8 GHz when Vctr is adjusted from 0.4 V to 1.6 V (see, e.g., points 98 and 100 in FIG. 10). In this example, circuit 46-2 in the high frequency mode may generate RF signals with an oscillation frequency of 11 GHz when Vctr is equal to 1.2 V (point 102).

The frequency ranges shown in FIGS. 9 and 10 are merely illustrative. If desired, additional VCO circuits may be used to provide desired frequency tuning ranges, a different number of varactors may be used in each varactor circuit, etc.

The foregoing is merely illustrative of the principles of this invention and various modifications can be made by those skilled in the art without departing from the scope and spirit of the invention.

What is claimed is:

1. An integrated circuit comprising:
   a voltage regulator having an output that supplies a power supply voltage;
   a voltage-controlled oscillator having a power supply terminal;
   a low-pass filter interposed between the output and the power supply terminal through which the power supply voltage is supplied to the power supply terminal, wherein the voltage-controlled oscillator comprises one of a plurality of voltage-controlled oscillators on the integrated circuit each of which has an associated power supply terminal that receives the power supply voltage; and
   a plurality of respective switch circuits each of which is respectively coupled between the output and an associated one of the power supply terminals.

2. The integrated circuit defined in claim 1 wherein the switch circuits comprise pass gates.

3. The integrated circuit defined in claim 2 wherein each pass gate has a control input that receives a respective control signal from a logic circuit on the integrated circuit.

4. The integrated circuit defined in claim 3 wherein each pass gate comprises an n-channel transistor and a p-channel transistor connected in parallel between the output and a respective one of the power supply terminals.

5. The integrated circuit defined in claim 4 wherein each switch circuit comprises an additional transistor that is connected to the power supply terminal associated with that switch circuit.

6. The integrated circuit defined in claim 5 wherein the additional transistor in each switch circuit comprises an n-channel pull-down transistor that is coupled between a ground terminal and the power supply terminal associated with that switch circuit.

7. The integrated circuit defined in claim 6 wherein the low-pass filter comprises an inductor that is coupled between the output and each of the plurality of power supply terminals and that reduces power supply noise for each of the voltage-controlled oscillators.

8. An integrated circuit comprising:
a voltage regulator having an output that supplies a power supply voltage;
a voltage-controlled oscillator having a power supply terminal; and
a low-pass filter interposed between the output and the power supply terminal through which the power supply voltage is supplied to the power supply terminal, wherein the low-pass filter comprises an inductor coupled in series between the output and the power supply terminal.

9. The integrated circuit defined in claim 8 further comprising a capacitor coupled between a ground terminal and the power supply terminal.

10. The integrated circuit defined in claim 9 further comprising a transmission gate interposed between the inductor and the power supply terminal, wherein the capacitor is coupled to the power supply terminal through the transmission gate.

11. The integrated circuit defined in claim 1 further comprising an additional low pass filter that is interposed between a ground terminal and the voltage-controlled oscillator.

12. The integrated circuit defined in claim 1 further comprising phase-locked-loop circuitry, wherein the voltage-controlled oscillator is included in the phase-locked-loop circuitry.

13. A phase-locked loop comprising:
a phase-frequency detector that produces error signals;
a charge pump that receives the error signals and that produces a corresponding output current;
a loop filter that receives the output current and that produces a corresponding first voltage signal;
a feedback path that provides signals to the phase-frequency detector;
a plurality of voltage-controlled oscillators each of which is interposed between the loop filter and the feedback path and each of which has a power supply terminal;
a voltage regulator that supplies a power supply voltage at a voltage regulator output;
a plurality of respective switch circuits each of which is respectively coupled between one of the plurality of power supply terminals and the voltage regulator output.

14. The phase-locked loop defined in claim 13 further comprising a low pass filter interposed between the voltage regulator output and each of the power supply terminals.

15. The phase-locked loop defined in claim 14 wherein each of the voltage-controlled oscillators has a ground power supply terminal, the phase-locked loop further comprising an additional low pass filter that is coupled to the ground power supply terminal.

16. The phase-locked loop defined in claim 15 wherein each switch circuit comprises a transmission gate and a pull-down transistor, wherein the pull-down transistor in each switch circuit is coupled between the transmission gate in that switch circuit and the ground power supply terminal.

17. Circuitry comprising:
a plurality of voltage controlled oscillators each of which has a respective power supply terminal and each of which produces output signals in a different respective range of frequencies; and
a plurality of switch circuits each of which is coupled between a line that carries a power supply voltage and a respective one of the power supply terminals, wherein each of the switch circuits comprises a pull-down transistor that is coupled to a ground power supply terminal.

18. The circuitry defined in claim 17 further comprising a low-pass filter coupled to the line that carries the power supply voltage.

19. The circuitry defined in claim 18 wherein the low-pass filter comprises at least one capacitor and at least one inductor and wherein the circuitry further comprises an additional low-pass filter coupled to the ground power supply terminal.

* * * * *